United States Patent [19]
Karner

[11] Patent Number: 6,115,259
[45] Date of Patent: Sep. 5, 2000

[54] VIBRATIONALLY ISOLATED TUNER

[75] Inventor: Kenneth Karner, Waukegan, Ill.

[73] Assignee: Zenith Electronics Corporation, Glenview, Ill.

[21] Appl. No.: 09/167,765

[22] Filed: Oct. 7, 1998

[51] Int. Cl.[7] ................................................ H05K 5/00
[52] U.S. Cl. .......................... 361/759; 361/748; 361/752; 361/753; 361/759; 439/76.1
[58] Field of Search .................................. 361/759, 752, 361/753, 748; 439/76.1

[56] References Cited

U.S. PATENT DOCUMENTS

| | | | |
|---|---|---|---|
| 4,628,412 | 12/1986 | Nigorikawa | 361/816 |
| 4,647,125 | 3/1987 | Landi et al. | 439/67 |
| 4,683,520 | 7/1987 | Grassens et al. | 361/825 |
| 4,686,461 | 8/1987 | Davis | 324/157 |
| 4,764,414 | 8/1988 | Beun | 428/195 |
| 5,313,015 | 5/1994 | Hoge | 174/35 R |
| 5,946,199 | 8/1999 | Matsazuki | 361/818 |

*Primary Examiner*—Leo P. Picard
*Assistant Examiner*—Tuan Dinh

[57] ABSTRACT

A vibration isolating mounting system for a tuner comprises a frame including a base portion having four upstanding angled members overlying the base portion. A tuner is mounted on a circuit board that includes four keyhole-shaped outwardly extending edge slots that are aligned with similar slots in the angled members and in the base portion. Four grommet-like elements cooperate with the edge slots to resiliently suspend the circuit board and tuner intermediate the angled members and the base portion.

8 Claims, 1 Drawing Sheet

VIBRATIONALLY ISOLATED TUNER

BACKGROUND OF THE INVENTION AND PRIOR ART

This invention relates generally to tuners and particularly to systems for shock mounting tuners. With the advent of digital advanced television receivers, tuners may operate at very high frequencies that approach the gigaHertz level. A major problem with digital signals is microphonics. At such high digital frequencies, vibration of the electronic elements can result in spurious noise and resonances and be very detrimental to tuner performance. Also, the digital signals are very sensitive to phase noise, a problem that was not a consideration in NTSC type tuners. The present invention is directed to a system of mounting a tuner that substantially isolates the tuner and its elements from environmental disturbances that could create such spurious resonances in the tuner circuits.

OBJECTS OF THE INVENTION

A principal object of the invention is to provide a novel tuner mounting system

Another object of the invention is to provide a high frequency tuner system that is substantially immune to environmental disturbances.

A further object of the invention is to provide simple, low cost mounting system for a high frequency tuner.

BRIEF DESCRIPTION OF THE DRAWINGS

These and other objects and advantages of the invention will be apparent upon reading the following description in conjunction with the drawings in which.

DESCRIPTION OF THE PREFERRED EMBODIMENT

Figure 1:
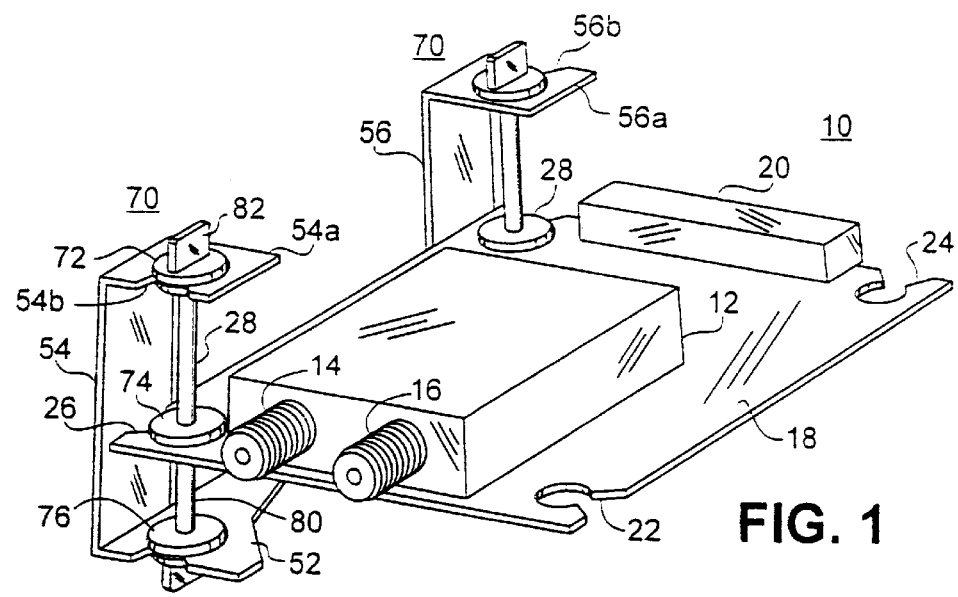
FIG. 1 is a partial perspective view of a tuner supported by the mounting system of the invention.
Figure 2:
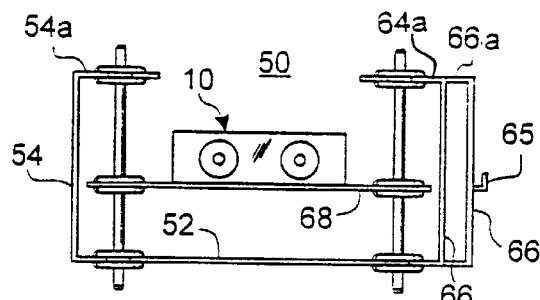
FIG. 2 is an end view of a tuner and mounting system of the invention.
Figure 3:
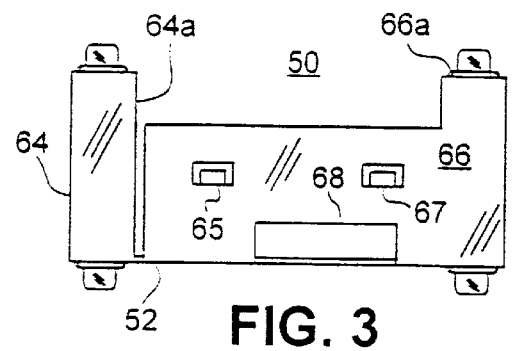
FIG. 3 is a side view of the tuner and mounting system of FIG. 2.
Figure 4:
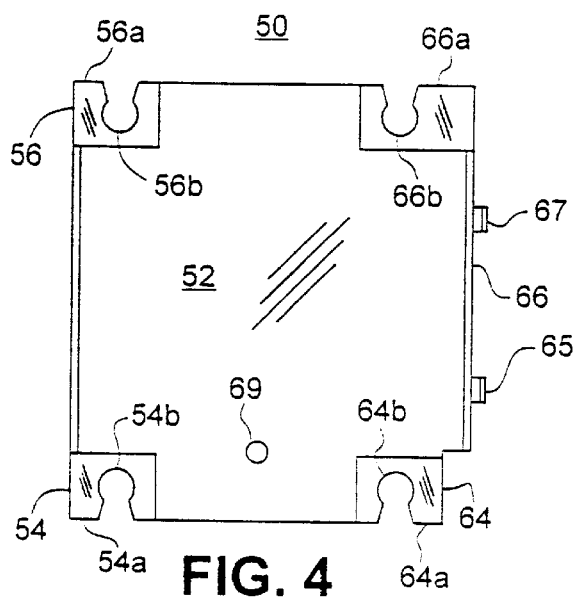
FIG. 4 is a plan view of the mounting frame of the invention.

Referring to FIG. 1, a tuner assembly 10 includes a high frequency tuner 12 having an input connector 14 and an output connector 16 secured at one end of a metal case that provides shielding for the tuner. The tuner 12 is supported on a circuit board 18 and has numerous electrical connections thereto, none of which is illustrated. An edge connector 20 is mounted on the far end of circuit board 18 and provides connections between the tuner and other circuitry of an advanced television receiver (not shown). Four keyhole shaped slots 22, 24, 26 and 28 are formed in the edges of circuit board 18 for cooperation with four grommet-like elements 70 (FIGS. 5 and 6) for supporting the tuner assembly on a frame 50 (FIGS. 2, 3 and 4). It should be noted that the edge slots in the circuit board 18 open outwardly to assist in engaging the middle grommet 74 of the grommet like elements 70 therein.

Referring additionally to FIGS. 2–4, frame 50 consists of a flat base portion 52 from which extend four upstanding angled elements 54, 56, 64 and 66. The top portions of the angled elements form upper supports 54a', 56a', 64a and 66a, each of which includes an outwardly extending keyhole-shaped edge slot 54b, 56b, 64b, and 66b, respectively. These edge slots engage with the top grommet 72 in the grommet like elements 70. It will be appreciated that similar outwardly extending keyhole-shaped edge slots are formed in base portion 52 in underlying alignment with the edge slots in the upper supports. Also, the positioning of the edge slots in circuit board 18 is such that the edge slots in the base portion, in the circuit board and in the upper supports are each in substantial vertical alignment. The edge slots in the base portion 52 cooperate with the lower grommets 76 in grommet-like elements 70. Upstanding member 66 extends substantially along the full length of one edge of the square shaped base portion 52 and includes a pair of mounting tabs 65 and 67 that are stamped and formed out of member 66. A rectangular cutout 68 in member 66 permits a mounting bracket on a chassis (neither shown) to cooperate with tabs 65, 67 and a screw hole 69 in base portion 52 for supporting the frame 50 on the chassis.

Figures 5, 6:
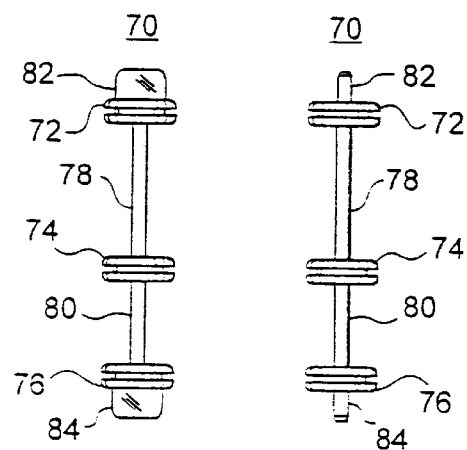
FIG. 5 illustrates the resilient grommet-like support element of the invention.
FIG. 6 is a side view of the grommet-like element of FIG. 5.

FIGS. 5 and 6 illustrate the grommet-like element 70, four of which are used in the invention. The top grommet 72 and the middle grommet 74 are connected by a thin resilient element 78 and the middle grommet 74 and the lower grommet 76 are connected by a thin resilient element 80. Tabs 82 and 84 extend from the top grommet and the bottom grommet, respectively, to assist in installing the grommet-like elements in the edge slots in the frame and circuit board Once installed, the tuner assembly is resiliently supported on the frame and is isolated from environmental disturbances to which the chassis and frame may be subject.

In practice, the grommet-like elements 70 are assembled to circuit board 18 by inserting the middle grommets 74 into the edge slots of the circuit board. It will be noted that edge slots 22 and 24 on the circuit board are positioned at right angles to edge slots 24 and 28. This orientation makes for a very secure arrangement of supporting elements for the circuit board. Continuing the assembly, the installer positions the circuit board in the frame and installs the top and bottom grommets in their corresponding edge slots in the upper support and base portion by grasping the end tabs 82 and 84 and manipulating the appropriate grommets into their corresponding edge slots. It will also be noted that the edge slots in the front angled supports 54a and 64a extend outwardly in an opposite direction to that of the edge slots in the rear angled supports 56a and 66a. The same orientation of edge slots is provided in the base portion 52. The arrangement not only makes for easier assembly, but also insures a secure mount for the tuner and circuit board since the openings of the edge slots are oppositely directed. Each of the grommet-like member preferably comprises a single piece of molded of rubber.

What has been described is a novel tuner mounting system that isolates the high frequency tuner assembly from environmental disturbances that could cause spurious noise and oscillation. It is recognized that numerous changes to the described embodiment of the invention will be apparent without departing from its true spirit and scope. The invention is to be limited only as defined in the claims.

What is claimed is:

1. A tuner system comprising:

a tuner;

a circuit board supporting said tuner;

a frame, including upper and lower portions straddling said circuit board; and resilient portions extending between said upper and lower portions of said frame and supporting said circuit board intermediate said upper and lower portions, said resilient portions comprising a plurality of grommet-like elements connected by thin resilient elements.

2. The system of claim 1, wherein said frame includes a base portion defining said lower supports and four upstanding angled elements defining said upper supports.

3. The system of claim 2, wherein said upper and lower portions and said circuit board each include keyhole shaped edge slots for enabling said grommet-like elements to be readily installed thereon.

4. The system of claim 3, further including axial tabs on the ends of each of said grommet-like elements for facilitating maneuvering of said grommet-like elements into position in said edge slots.

5. The system of claim 4, wherein said edge slots in said frame are outwardly extending and at least some of said edge slots in said circuit board extend at right angles to said edge slots in said frame.

6. A tuner system comprising:

a tuner;

a circuit board supporting said tuner;

a frame including a base portion, defining lower portions, and four upstanding angled elements defining upper portions, said upper portions and said lower portions straddling said circuit board;

four grommet-like elements extending between and supporting said circuit board intermediate said upper portions and said lower portions, each of said four grommet-like elements including thin resilient elements; and said upper portions, said lower portions and said circuit board each including keyhole shaped edge slots for enabling said grommet-like elements to be readily installed thereon.

7. The system of claim 6, further including axial tabs on the ends of each of said grommet-like elements for facilitating maneuvering of said grommet-like elements into position into said edge slots.

8. The system of claim 7, wherein said edge slots in said frame are outwardly extending and at least some of said edge slots in said circuit board extend at right angles to said edge slots in said frame.

* * * * *